(12) United States Patent
Kim et al.

(10) Patent No.: US 11,398,483 B2
(45) Date of Patent: Jul. 26, 2022

(54) METHOD OF MANUFACTURING ELECTRODE LAYER, METHOD OF MANUFACTURING CAPACITOR USING THE SAME, CAPACITOR, AND MEMORY DEVICE INCLUDING THE SAME

(71) Applicant: KOREA INSTITUTE OF SCIENCE AND TECHNOLOGY, Seoul (KR)

(72) Inventors: Sang Tae Kim, Seoul (KR); Hyun-Cheol Song, Seoul (KR); Seung Hyub Baek, Seoul (KR); Ji-Won Choi, Seoul (KR); Jin Sang Kim, Seoul (KR); Chong Yun Kang, Seoul (KR); Seong Keun Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 93 days.

(21) Appl. No.: 16/854,471

(22) Filed: Apr. 21, 2020

(65) Prior Publication Data
US 2021/0005609 A1    Jan. 7, 2021

(30) Foreign Application Priority Data

Jul. 1, 2019   (KR) .................. 10-2019-0078603
Jan. 3, 2020  (KR) .................. 10-2020-0000617

(51) Int. Cl.
*H01L 27/108*   (2006.01)
*H01L 49/02*    (2006.01)
*H01L 21/285*   (2006.01)

(52) U.S. Cl.
CPC .. *H01L 27/10805* (2013.01); *H01L 21/28556* (2013.01); *H01L 27/1085* (2013.01); *H01L 28/91* (2013.01)

(58) Field of Classification Search
CPC ......... H01L 27/10805; H01L 21/28556; H01L 27/1085; H01L 28/91
See application file for complete search history.

(56) References Cited

U.S. PATENT DOCUMENTS 6,136,641 A      10/2000  Won et al.
2013/0052790 A1   2/2013  Deweerd et al.

FOREIGN PATENT DOCUMENTS

KR   1020060087315 A   8/2006
KR   1020100094766 A   8/2010

(Continued)

OTHER PUBLICATIONS

Kim et al., "Controlling the Composition of Doped Materials by ALD: A Case Study for Al-Doped TiO2 Films," Electrochemical and Solid-State Letters, 2008, vol. 11 (7), pp. G27-G29.

*Primary Examiner* — Mohammed R Alam

(57) ABSTRACT

A method of manufacturing an electrode layer and a method of manufacturing a capacitor using the same are provided. The method of manufacturing the electrode layer includes performing a first sub-cycle sequentially providing a tin precursor and an oxygen source on a substrate, performing a second sub-cycle sequentially providing a tin precursor, a tantalum precursor, and an oxygen source on the substrate on which the first sub-cycle is performed, and repeating a cycle including the first sub-cycle and the second sub-cycle to form a tantalum-doped tin oxide layer on the substrate. A tantalum concentration in the tantalum-doped tin oxide layer is determined by the tin precursor provided in the second sub-cycle.

7 Claims, 16 Drawing Sheets

(56) References Cited

FOREIGN PATENT DOCUMENTS

| | | | |
|---|---|---|---|
| KR | 101455003 | | 11/2014 |
| KR | 20170119119 A | * | 10/2017 |
| KR | 1020170119119 A | | 10/2017 |
| KR | 1020180099197 A | | 9/2018 |
| KR | 101892632 B1 | | 10/2018 |
| KR | 1020180124921 A | | 11/2018 |

* cited by examiner

METHOD OF MANUFACTURING ELECTRODE LAYER, METHOD OF MANUFACTURING CAPACITOR USING THE SAME, CAPACITOR, AND MEMORY DEVICE INCLUDING THE SAME

CROSS-REFERENCE TO RELATED APPLICATIONS

A claim for priority under 35 U.S.C. § 119 is made to Korean Patent Application No. 10-2019-0078603 filed on Jul. 1, 2019 and 10-2020-0000617 filed on Jan. 3, 2020 in the Korean Intellectual Property Office, the entire contents of which are hereby incorporated by reference.

BACKGROUND

Embodiments of the present invention described herein relate to a method of manufacturing an electrode layer, a method of manufacturing a capacitor using the same, a capacitor, and a memory device, more particularly, to a method of manufacturing a metal oxide layer, a method of manufacturing a capacitor using the same, a capacitor, and a memory device.

In order to increase capacity and integration of a dynamic random access memory (DRAM) device, a size of DRAM device has continuously decreased and it is inevitable that a capacitor which stores charge is changed to keep scale-down. This is because, as a size of the DRAM device is decreased, an area of the capacitor becomes smaller and the amount of charge is proportional to the area of the capacitor. To this end, a high dielectric thin layer has been studied to maintain a low leakage current while ensuring sufficient capacitance.

Currently, $ZrO_2/Al_2O_3/ZrO_2$ is used as the dielectric layer, and TiN is used as an electrode material. However, further scale-down is difficult due to material limitation of $ZrO_2/Al_2O_3/ZrO_2$ and new dielectric development is urgently needed.

Rutile $TiO_2$ and $SrTiO_3$ attract attention as major dielectric candidates, and are considered to be the most applicable in the future. However, because these dielectrics have a small band gap to generate a leakage current problem, TiN is incapable of being used as an electrode, and thus a new electrode material is needed. An oxide electrode having the same crystal structure as a dielectric is advantageous as a novel electrode such that the oxide electrode easily crystallizes the dielectric.

$RuO_2$ attracts attention for $TiO_2$ having a rutile structure and $SrRuO_3$ attracts attention for $SrTiO_3$. However, the oxide electrode including Ru is very easily reduced during hydrogen heat treatment in a subsequent DRAM process, thereby causing a problem of deterioration of the DRAM device. This is because of physical characteristics of the RuOx material itself, and thus it is difficult to be solved by improvement of the process. Therefore, the development of a new oxide, which is capable of inducing crystallization of $TiO_2$ well like $RuO_2$, has excellent electrical characteristics, and excellent reduction resistance, is needed.

SUMMARY

Embodiments of the present invention is to solve the above technical problem, an object of the present invention is to provide a method for manufacturing an electrode layer excellent in high electrical characteristics and reduction resistance, and a method for manufacturing a capacitor using the same.

A method of manufacturing an electrode layer according to an embodiment of the present invention includes performing a first sub-cycle sequentially providing a tin precursor and an oxygen source on a substrate performing a second sub-cycle sequentially providing a tin precursor, a tantalum precursor, and an oxygen source on the substrate on which the first sub-cycle is performed, and repeating a cycle including the first sub-cycle and the second sub-cycle to form a tantalum-doped tin oxide layer on the substrate, wherein a tantalum concentration in the tantalum-doped tin oxide layer is determined by the tin precursor provided in the second sub-cycle.

In an embodiment, the performing of the first sub-cycle may include providing a first purge gas after the providing of the tin precursor and providing a second purge gas after the providing of the oxygen source. The performing of the second sub-cycle may include providing a first purge gas after the providing of the tin precursor, providing a second purge gas after the providing of the tantalum precursor, and providing a third purge gas after the providing of the oxygen source.

In an embodiment, the electrode layer may have a rutile structure.

In an embodiment, the electrode layer may have a tantalum atomic weight 1.0 to 3.0 at % with respect to a sum of the tantalum atomic weight and a tin atomic weight.

A method of manufacturing an electrode layer according to an embodiment of the present invention includes performing a first sub-cycle sequentially providing a tin precursor, a first purge gas, an oxygen source, and a second purge gas on a substrate, performing a second sub-cycle sequentially providing a tin precursor, a first purge gas, a tantalum precursor, a second purge gas, an oxygen source, and a third purge gas on the substrate on which the first sub-cycle is performed, and repeating a cycle including the first sub-cycle and the second sub-cycle to form a tantalum-doped tin oxide layer on the substrate, wherein, in the second sub-cycle, a tantalum atomic weight is 1.0 to 3.0 at % with respect to a sum of the tantalum atomic weight and a tin atomic weight.

In an embodiment, the electrode layer may have a rutile structure.

A method of manufacturing a capacitor according to an embodiment of the present invention includes performing a first sub-cycle sequentially providing a tin precursor, a first purge gas, an oxygen source, and a second purge gas on a substrate, performing a second sub-cycle sequentially providing a tin precursor, a first purge gas, a tantalum precursor, a second purge gas, an oxygen source, and a third purge gas on the substrate on which the first sub-cycle is performed, repeating a cycle including the first sub-cycle and the second sub-cycle to form a lower electrode including a tantalum-doped tin oxide layer on the substrate, forming a dielectric layer on the lower electrode, and forming an upper electrode on the dielectric layer, wherein the lower electrode has a rutile structure and in the second sub-cycle, a tantalum atomic weight is 1.0 to 3.0 at % with respect to a sum of the tantalum atomic weight and a tin atomic weight.

In an embodiment, the lower electrode may have a cylinder or pillar structure in which a bottom is closed, and an aspect ratio of the lower electrode may be 10 or more.

In an embodiment, the dielectric layer may have a dielectric constant of 75 or more.

A capacitor according to an embodiment of the present invention includes a lower electrode including a tantalum-doped tin oxide (Ta-doped $SnO_2$) and having a tantalum concentration of 1.5 to 5.5 at % with respect to a sum of tin and tantalum, a dielectric layer disposed on the lower electrode and including a rutile structure of titanium oxide ($TiO_2$) and strontium titanium oxide ($SrTiO_3$), and an upper electrode disposed on the dielectric layer.

In an embodiment, the capacitor may further include a substrate and the lower electrode may be disposed on the substrate and has a cylinder or pillar shape with a bottom surface closed.

In an embodiment, the lower electrode may have an aspect ratio of 10 or more.

In an embodiment, the upper electrode may include at least one of indium (In), cobalt (Co), silicon (Si), germanium (Ge), gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chromium (Cr), molybdenum (Mo), Niobium (Nb), aluminum (Al), nickel (Ni), copper (Cu) and titanium nitride (TiN), or alloys thereof.

In an embodiment, the upper electrode may include at least one of ruthenium oxide ($RuO_2$), tungsten oxide ($WO_2$), molybdenum oxide ($MoO_2$), nickel oxide (NiO), iridium oxide ($IrO_2$), tantalum doped tin oxide (Ta-doped $SnO_2$), zinc oxide (ZnO), indium tin oxide (InSnO), and indium gallium zinc oxide (InGaZnO), or alloys thereof.

In an embodiment, the lower electrode may have a rutile structure.

In an embodiment, the dielectric layer may have a dielectric constant of 75 or more.

A memory device according to an embodiment of the present invention includes a substrate, a switching element disposed on the substrate, and a capacitor electrically connected to the switching element, and a lower electrode electrically connected to the switching element on the substrate, including a rutile structured tantalum-doped tin oxide (Ta-doped $SnO_2$), and having a cylinder or pillar structure with a closed bottom surface, a dielectric layer disposed along inner and outer sides of the lower electrode, and including a rutile structure of titanium oxide ($TiO_2$) and strontium titanium oxide ($SrTiO_3$), and an upper electrode disposed on the dielectric layer.

In an embodiment, the lower electrode may include a tantalum concentration of 1.5 to 5.5 at % with respect to a sum of tin and tantalum.

In an embodiment, the dielectric layer may have a dielectric constant of 75 or more.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the present invention will be described clearly and in detail so that those skilled in the art may easily carry out the present invention.

Figure 1:
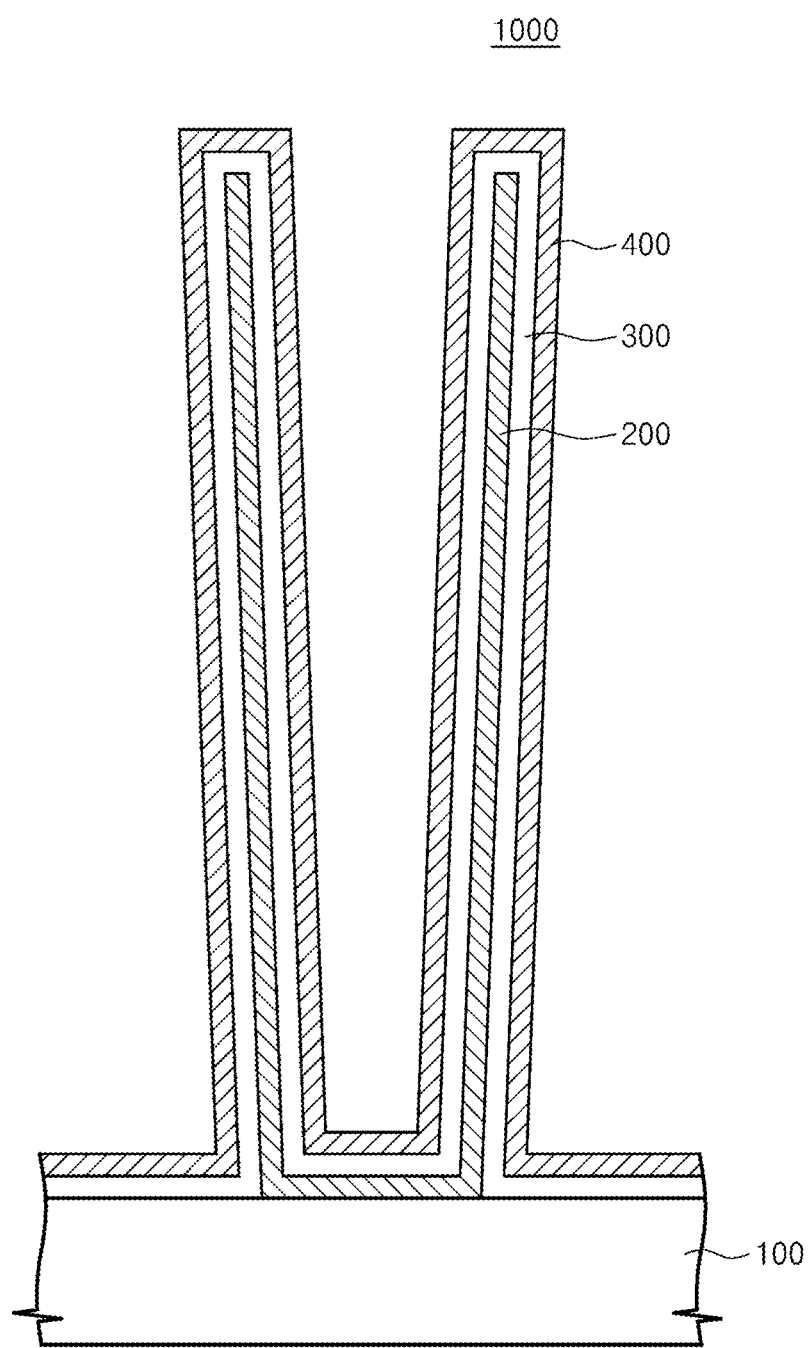
FIG. 1 is a cross-sectional view for illustrating a capacitor according to an embodiment of the present invention.

FIG. 1 is a cross-sectional view for illustrating a capacitor according to an embodiment of the present invention.

Referring to FIG. 1, a capacitor 1000 may include may a lower electrode 200, a dielectric layer 300, and an upper electrode 400, which are sequentially stacked on the substrate 100.

The substrate 100 may include a semiconductor material, for example silicon (Si), germanium (Ge), gallium arsenide (GaAs), zinc oxide (ZnO), silicon carbide (SiC), silicon germanium (SiGe), gallium nitride (GaN), gallium (III) oxide ($Ga_2O_3$), and sapphire.

Meanwhile, the substrate 100 may include a conductive material, for example, may include at least one of gold (Au), nickel (Ni), tungsten (W), molybdenum (Mo), copper (Cu), aluminum (Al), tantalum (Ta), silver (Ag), platinum (Pt), and chromium (Cr) or an alloy thereof.

The lower electrode 200 may be disposed on the substrate 100, and may have a cylinder or pillar shape in which a lower portion thereof is closed. For example, the lower electrode 200 may have a cross section of a "U" shape. An area of the capacitor 1000 decreases as a size of the device including the capacitor 1000 continuously decreases. Since the amount of charge is proportional to the area, the lower electrode 200 of the cylinder or pillar structure having a large aspect ratio should be adopted to secure sufficient capacitance. The lower electrode 200 having the cylinder structure, which has the large aspect ratio, may be formed by an atomic layer deposition process (ALD).

The lower electrode 200 may include a metal oxide. According to an embodiment, the metal oxide may include a material that does not degrade in a subsequent process such as heat treatment. In addition, the dielectric layer 300 may be grown on the lower electrode 200 and the lower electrode 200 may include a material having a crystal structure similar to that of the dielectric layer 300 to facilitate growth of the dielectric layer 300. In an embodiment, the lower electrode 200 may include tantalum-doped tin oxide (Ta-doped $SnO_2$).

According to one embodiment, when the lower electrode 200 includes tantalum-doped tin oxide, a concentration of tantalum which is doped may be substantially uniform in the entire region of the lower electrode 200. In addition, in the lower electrode 200, tantalum may be uniformly doped to have a concentration of 1.5 to 5.5 at % with respect to a sum of tin and tantalum.

Since tantalum is a dopant and tantalum ions displace tin in the tantalum-doped tin oxide to release free electrons, the uniform composition distribution of tantalum in the lower electrode 200 may play an important role in resistivity and carrier concentration of the lower electrode 200.

The dielectric layer 300 may be continuously disposed thinly along inner and outer walls of the lower electrode 200. The dielectric layer 300 is disposed in contact with the inner and outer walls of the lower electrode 200 to increase the capacitance.

The dielectric layer 300 may include a metal oxide having a dielectric constant greater than that of silicon oxide to reduce leakage current of the capacitor 1000. The dielectric layer 300 may include a material, which ensures sufficient capacitance, maintains low leakage current, and is suitable for scale-down of a semiconductor device.

As the material described above, the dielectric layer 300 may include titanium oxide ($TiO_2$) and strontium titanium oxide ($SrTiO_3$) having a rutile structure. The titanium oxide and the strontium titanium oxide having the rutile structure have a problem of leakage current due to a small band gap, and thus there is need for the lower electrode 200, which has a large work function and has the same crystal structure as the dielectric layer 300 to easily crystallize the dielectric layer 300. Therefore, when the rutile titanium oxide is used as the dielectric layer 300, ruthenium oxide ($RuO_2$) may be used as the lower electrode 200. In addition, when the strontium titanium oxide is used as the dielectric layer 300, strontium ruthenium oxide ($SrRuO_3$) may be used as the lower electrode 200. However, the lower electrode 200 including ruthenium (Ru) tends to be easily reduced in a subsequent hydrogen heat treatment process. Accordingly, the lower electrode 200 may include tantalum-doped tin oxide that induces crystallization of the dielectric layer 300 well, has excellent electrical characteristics, and has excellent reduction resistance.

The upper electrode 400 may be continuously disposed thinly along the shape of the lower electrode 200 on the dielectric layer 300. Meanwhile, the upper electrode 400 may be provided while completely filling the inside and the outside of the lower electrode 200 on which the dielectric layer 300 is formed. In the present invention, the structure of the upper electrode 400 is not limited.

The upper electrode 400 may include a conductive material, for example, may include at least one of indium (In), cobalt (Co), silicon (Si), germanium (Ge), gold (Au), palladium (Pd), platinum (Pt), Ruthenium (Ru), Rhenium (Re), Magnesium (Mg), Zinc (Zn), Hafnium (Hf), Tantalum (Ta), Rhodium (Rh), Iridium (Ir), Tungsten (W), Titanium At least one of (Ti), silver (Ag), chromium (Cr), molybdenum (Mo), niobium (Nb), aluminum (Al), nickel (Ni), copper (Cu), and titanium nitride (TiN) and an alloy thereof. The upper electrode 400 may include a metal oxide, for example, may include at least one of ruthenium oxide ($RuO_2$), tungsten oxide ($W_2$), molybdenum oxide ($MoO_2$), nickel oxide (NiO), iridium oxide ($IrO_2$), tantalum doped tin oxide (Ta-doped $SnO_2$), zinc oxide (ZnO), indium tin oxide (InSnO), and indium gallium zinc oxide (InGaZnO) or an alloy thereof. In the present invention, the material of the upper electrode 400 is not limited to the above materials.

Hereinafter, a method of manufacturing the capacitor 1000 will be described in detail.

FIGS. 2 to 5 are cross-sectional views illustrating a method of manufacturing a capacitor according to an embodiment of the present invention.

Figure 2:
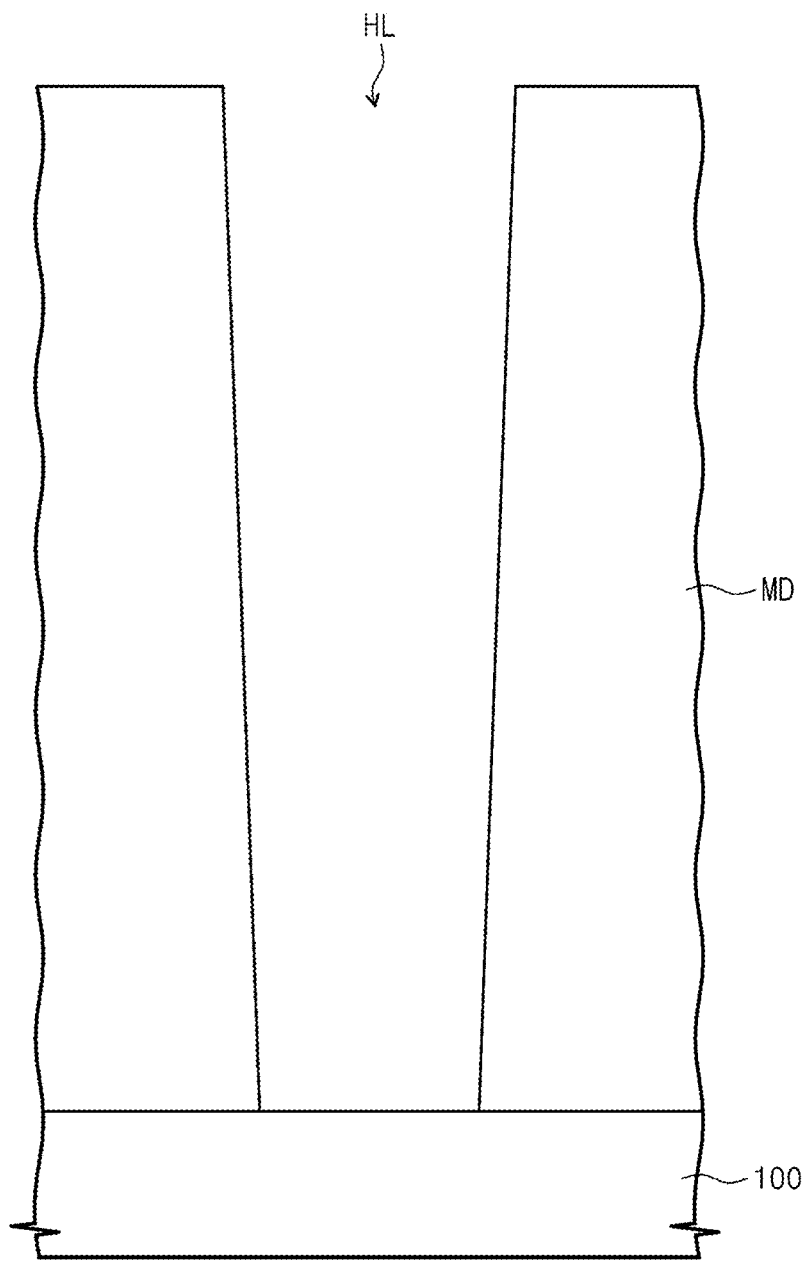
FIGS. 2 to 5 are cross-sectional views for illustrating a method of manufacturing a capacitor according to an embodiment of the present invention.

Referring to FIG. 2, a molding layer MD having a hole HL may be formed on a substrate 100.

The mold layer MD may be formed on the substrate 100. The mold layer MD may include silicon oxide, silicon nitride, and silicon oxynitride. After forming a mask pattern on the mold layer MD, the hole HL exposing the substrate 100 may be formed by etching using the mask pattern as an etching mask. After the hole HL is formed, the mask pattern may be removed from the mold layer MD.

Figure 3:
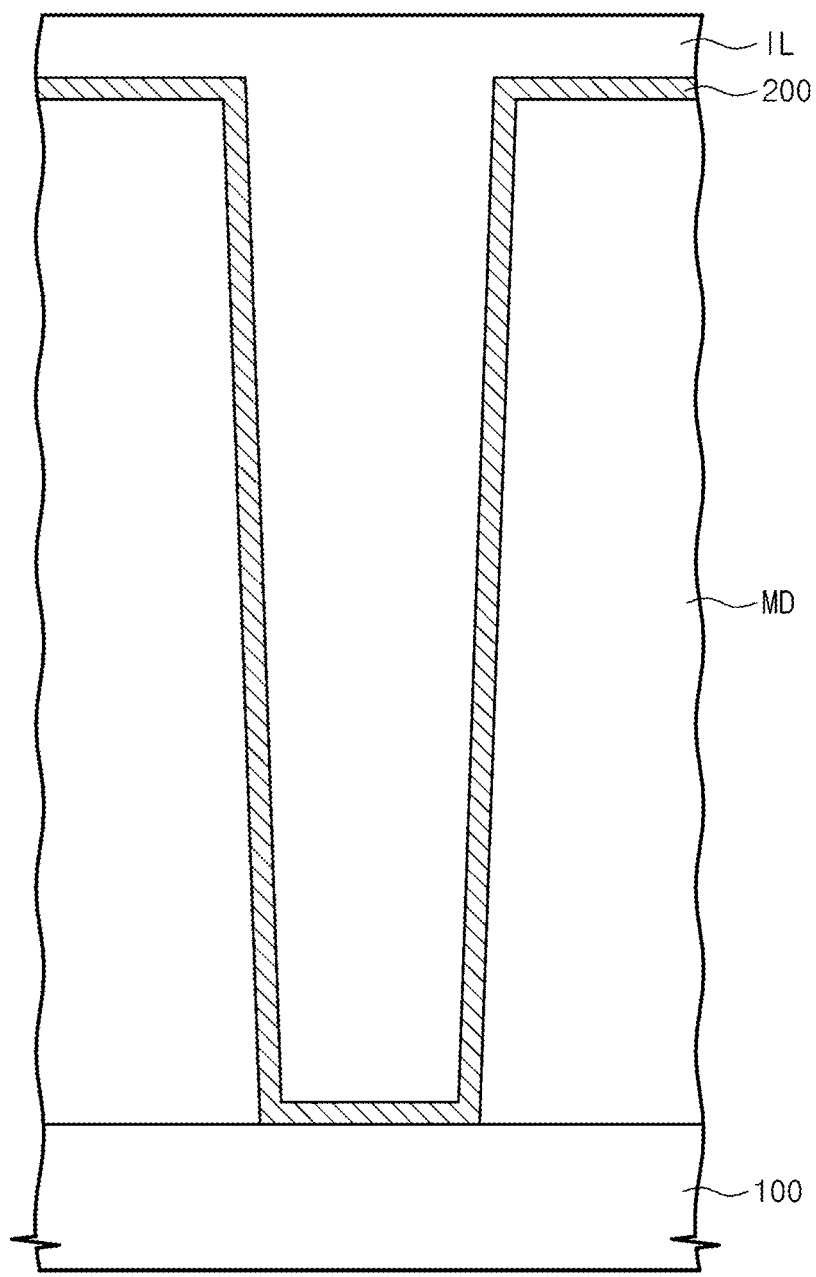
Figure 6:
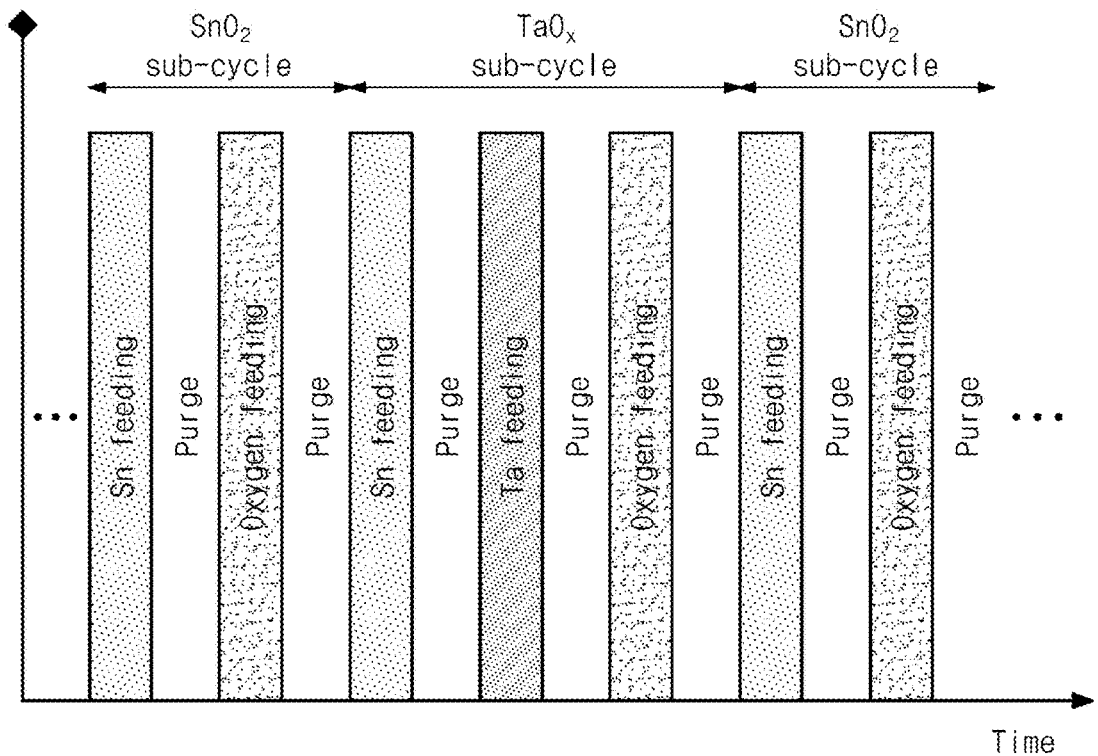
FIG. 6 is a view for illustrating a cycle of an atomic layer deposition process for manufacturing a lower electrode of a capacitor according to an embodiment of the present invention.

Referring to FIG. 3, the lower electrode 200 may be formed on the mold layer MD having the hole HL through an atomic layer deposition process. Hereinafter, the process of forming the lower electrode 200 will be described in detail. FIG. 6 is a view for illustrating a cycle of an atomic layer deposition process for manufacturing the lower electrode 200 of the capacitor 100 according to an embodiment of the present invention.

In general, the atomic layer deposition process may form a desired thin layer through a plurality of cycles that sequentially provide a plurality of metal-organic precursors. Here, each of the metal organic precursors should be provided at least in minimum amount or more to form a layer.

According to the present invention, referring to FIG. 6, after loading the mold layer MD having the hole HL into a process chamber, a tin precursor, a purge gas, an oxygen source, and a purge gas may be sequentially provided to perform a first sub-cycle. When the first sub-cycle is performed, a first layer including tin oxide may be formed on the surface of the substrate 100 and the mold layer MD.

The tin precursor may include at least one of tetrakis (dimethylamino)tin (TDMASn), tetraethyltin (TET), tetramethyltin (TMT), tin(II)acetylacetonate ($Sn(acac)_2$), $SnCl_4$, dimethylamino-2-methyl-2-propoxy-tin(II) ($Sn(dmamp)_2$), and Bis[bis(trimethylsilyl)amino]tin(II) and the oxygen source may be provided in the form of ozone ($O_3$) or water vapor ($H_2O$). Meanwhile, the purge gas may include an inert gas such as nitrogen ($N_2$) or argon (Ar).

A tin precursor, a purge gas, a tantalum precursor, a purge gas, an oxygen source, and a purge gas may be sequentially provided to perform a second sub-cycle. When the second sub-cycle is performed, a second layer may be formed in which tantalum is doped in tin oxide as a dopant.

The tin precursor may include tetrakis(dimethylamino)tin (TDMASn), the tantalum precursor may include (tert-butyl-imido)tris(ethylmethylamido) tantalum (TBTEMTa), and the oxygen source may be provided in the form of ozone ($O_3$) or water vapor ($H_2O$). Meanwhile, the purge gas may include nitrogen.

According to an embodiment, in the second sub-cycle, when the tin precursor is first provided at the surface of the first layer and then the tantalum precursor is provided, reactivity between the tin precursor and the tantalum precursor may be small to reduce the amount of tantalum functioning as a dopant due to tin. That is, although a minimum amount of tantalum precursor is provided, the amount of tantalum reacting to the first layer may be smaller than the minimum amount. In addition, the number of cycles may be increased to match the desired concentration of tantalum. As a result, the concentration of tantalum serving as a dopant of the lower electrode 200 may be small, but the number of cycles may be increased to have a uniform concentration of tantalum throughout the lower electrode 200.

The first sub-cycle and the second sub-cycle may constitute a cycle. The cycle may be repeated a plurality of times to form the lower electrode 200 including the tantalum-doped tin oxide, which has a desired thickness.

Figure 4:
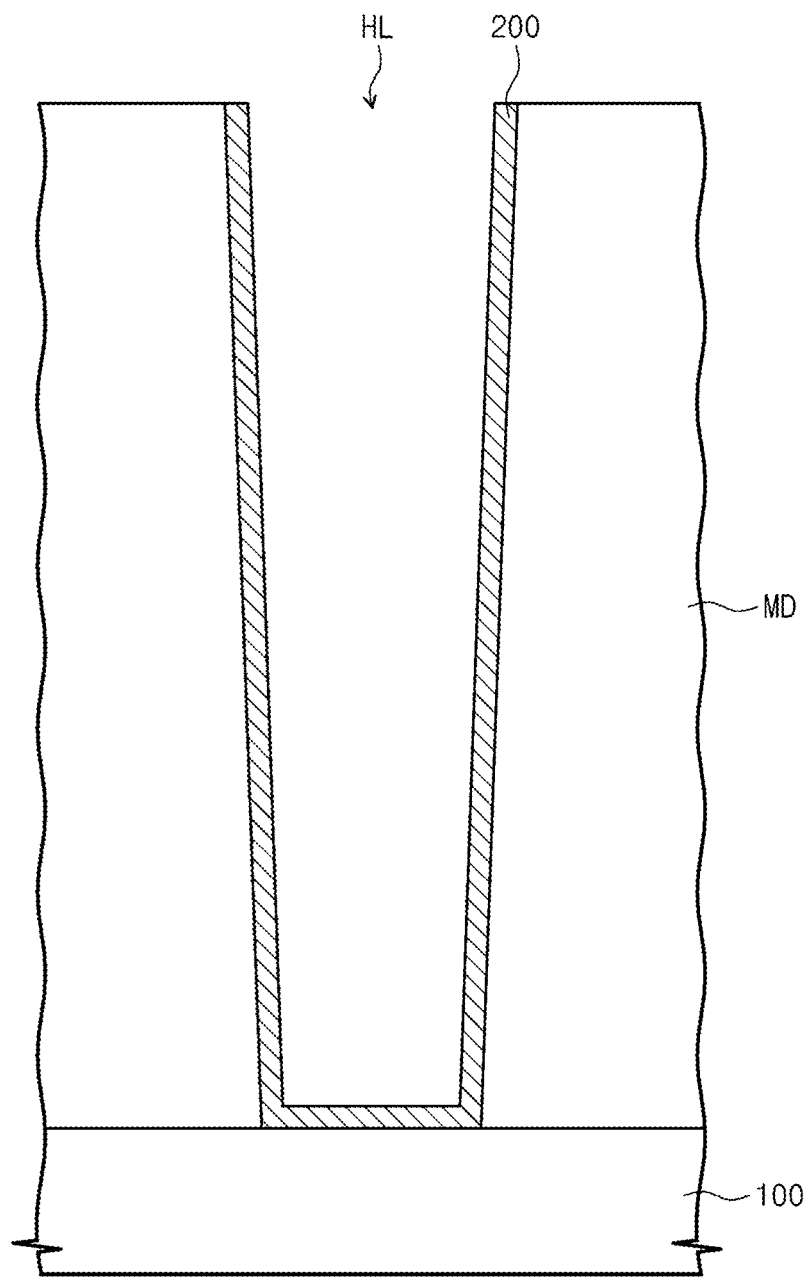

Referring to FIG. 4, an insulating layer IL filling the hole HL in which the lower electrode 200 is formed is formed. The insulating layer IL may include a material having an etching selectivity with respect to the lower electrode 200 and the mold layer MD based on an etchant. For example, when the mold layer MD includes nitride and the lower electrode 200 includes the tantalum-doped tin oxide, the insulating layer IL may include silicon oxide or a photoresist material.

A portion of the insulating layer IL and the lower electrode 200 may be removed to expose an upper surface of the mold layer MD, and thus the lower electrode 200 may be formed by node separation. As described above, since the insulating layer IL includes a material having an etching selectivity with respect to the lower electrode 200 and the mold layer MD based on an etchant, the mold layer MD may not be substantially etched while the portion of the insulating layer IL and the lower electrode 200 is removed and therefore, the mold layer MD may also function as an etch stop layer.

After the lower electrode 200 is formed by the node separation, the insulating layer IL filling the hole HL may be removed. Similarly, since the insulating layer IL includes a material having an etching selectivity with respect to the lower electrode 200 and the mold layer MD based on an etchant, the mold layer MD may not be removed while the lower electrode 200 and the insulating layer IL are removed. The inner wall of the lower electrode 200 may be exposed by removing the insulating layer IL.

Figure 5:
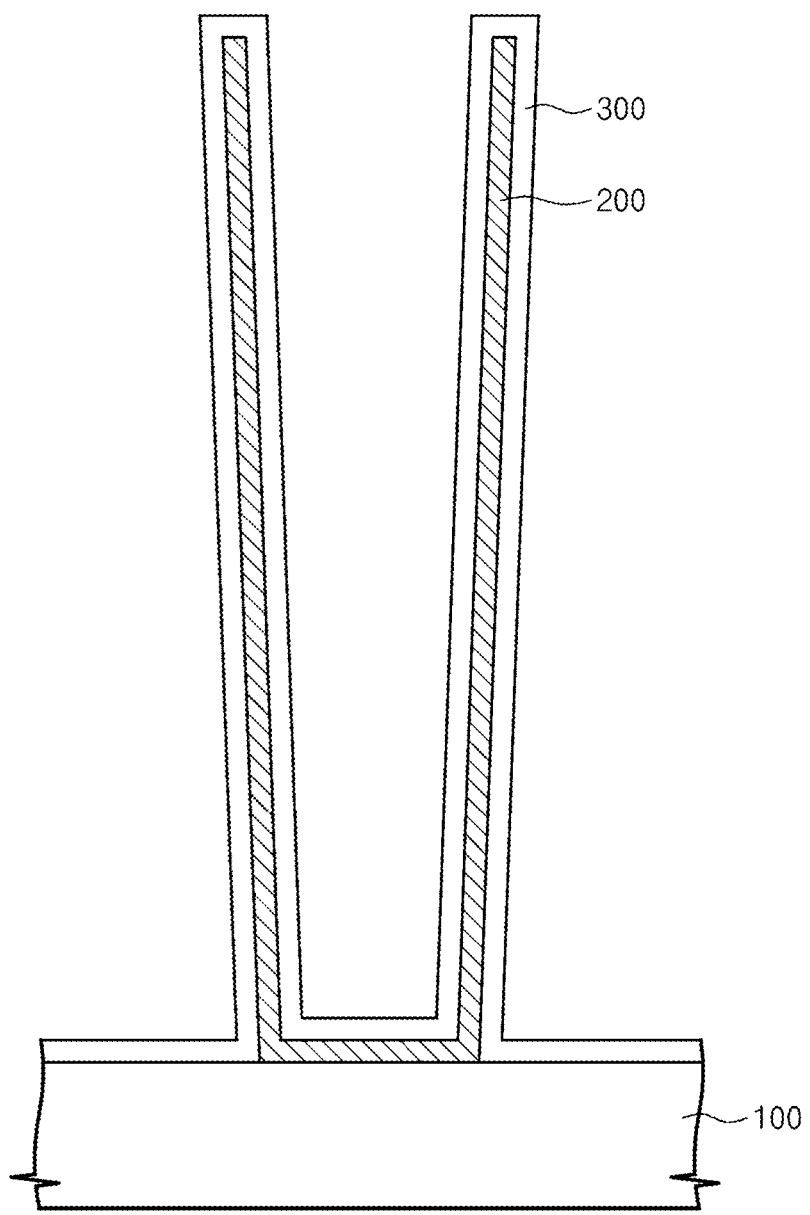

Referring to FIG. 5, the mold layer MD may be removed to expose the outer wall of the lower electrode 200. Since the mold layer MD has an etching selectivity with respect to the lower electrode 200 based on an etchant, the lower electrode 200 may not be etched substantially while the mold layer MD is removed.

Subsequently, the dielectric layer 300 may be thinly and continuously formed on the lower electrode 200. For example, the dielectric layer 300 may be formed by a chemical vapor deposition or an atomic layer deposition process.

As described above, since the lower electrode 200 has a rutile structure, the dielectric layer 300 including a material having a high dielectric constant of the rutile structure may be formed. According to an embodiment, the dielectric layer 300 may include titanium oxide having a rutile structure.

Referring to FIG. 1, the upper electrode 400 may be thinly and continuously formed on the dielectric layer 300. For example, the upper electrode 400 may be formed by a chemical vapor deposition or an atomic layer deposition process.

Meanwhile, the upper electrode 400 may be formed while filling the lower electrode 200 in which the dielectric layer 300 is formed.

Hereinafter, characteristics of the tantalum-doped tin oxide layer formed by the general atomic layer deposition process and the tantalum-doped tin oxide layer formed by the atomic layer deposition process according to an embodiment of the present invention will be described.

Figure 7:
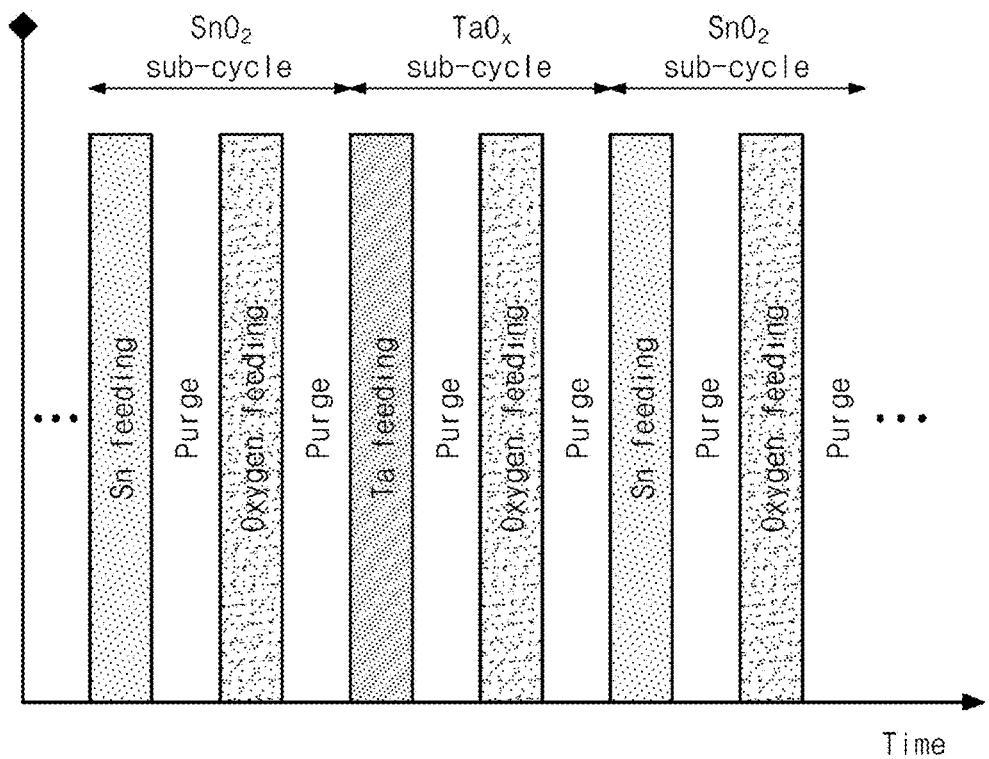
FIG. 7 is a view for illustrating a cycle when a tantalum-doped tin oxide layer is formed by a general atomic layer deposition process.

FIG. 7 is a view for illustrating a cycle when a tantalum-doped tin oxide layer is formed by a general atomic layer deposition process.

Referring to FIG. 7, in the general atomic layer deposition process, one cycle includes a first sub-cycle including tin precursor injection, purge gas injection, oxygen source injection, and purge gas injection and a second sub-cycle including tantalum precursor injection, purge gas injection, oxygen gas injection, and purge gas injection.

As described above in FIG. 6, in the atomic layer deposition process according to an embodiment of the present invention one cycle includes a first sub-cycle including tin precursor injection, purge gas injection, oxygen source injection, and purge gas injection and a second sub-cycle including tin precursor injection, purge gas injection, tantalum precursor injection, purge gas injection, oxygen gas injection, and purge gas injection.

FIGS. 6 and 7, in the general atomic layer deposition process and the atomic layer deposition process according to an embodiment, there is a difference in the second sub-cycle. As illustrated in FIG. 6, the tin precursor may be provided and then the tantalum precursor may be provided without oxygen gas injection to implant tantalum having a smaller amount than the amount of the provided tantalum precursor, thereby obtaining the layer, which is doped with tantalum at an overall uniform concentration.

Alternatively, in FIG. 7, the tantalum precursor may be provided without injecting the tin precursor to obtain the layer having a high tantalum doping concentration in comparison with FIG. 6.

Figure 8:
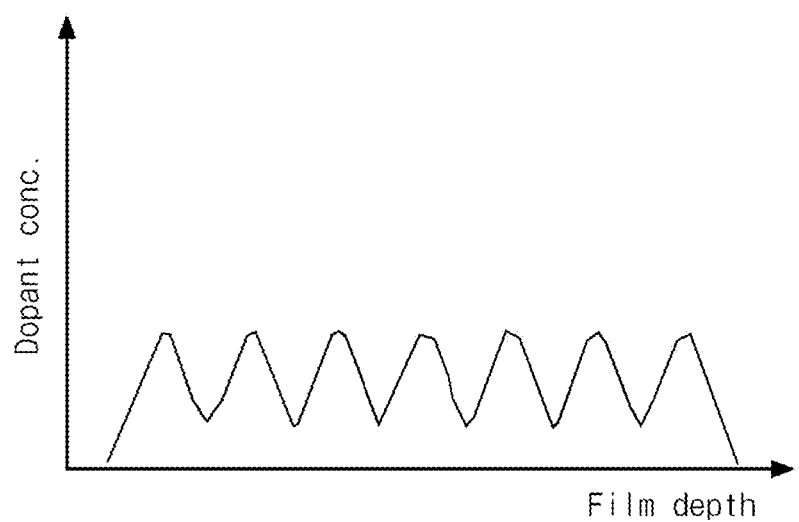
FIG. 8 is a graph illustrating a tantalum doping concentration depending on a depth of a layer formed by an atomic layer deposition process according to an embodiment of the present invention.
Figure 9:
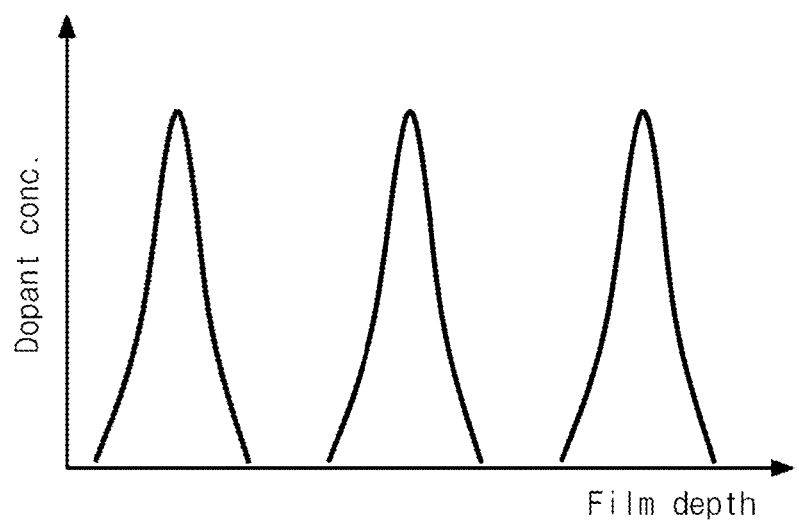
FIG. 9 is a graph illustrating a tantalum doping concentration depending on a depth of a layer formed by a general atomic layer deposition process.

FIG. 8 is a graph illustrating a tantalum doping concentration depending on a depth of a layer formed by an atomic layer deposition process according to an embodiment of the present invention and FIG. 9 is a graph illustrating a tantalum doping concentration depending on a depth of a layer formed by a general atomic layer deposition process.

A width between the highest point and the lowest point of the tantalum doping concentration depending on the depth of the layer according to an embodiment of the present invention illustrated in FIG. 8 may be smaller than that of the layer according to the general process illustrated in FIG. 9.

A distance between two adjacent peaks of the tantalum doping concentration of the layer according to an embodiment of the present invention FIG. 8 may be smaller than that of the layer according to the general process illustrated in FIG. 9.

A reason why the highest concentration of tantalum in the atomic layer deposition process according to an embodiment is lower than the highest peak of tantalum concentration in the conventional atomic layer deposition process is as follows. The amount of the tantalum precursor provided in the second sub-cycle of the general atomic layer deposition process is the same as the tantalum precursor provided in the second sub-cycle of the atomic layer deposition process according to an embodiment. However, the amount of tantalum doped by performing the second sub-cycle of the atomic layer deposition process according to an embodiment may be less than the amount of tantalum doped by performing the second sub-cycle of the general atomic layer deposition process. This is because tin of the tin precursor during the second sub-cycle of the atomic layer deposition process according to an embodiment is less reactive with tantalum to prevent tantalum from being bonded, and thus a small amount of tantalum may be doped although the same amount of tantalum precursor is provided as the general amount.

Furthermore, a reason why the distance between the concentration peaks of tantalum in the atomic layer deposition process according to an embodiment is smaller than the distance between the concentration peaks of tantalum in the general atomic layer deposition process is as follows. The atomic layer deposition process according to an embodiment may reduce the doping concentration of tantalum and increase the frequency of cycles to compensate for the reduced concentration.

Thus, it may be seen that the layer formed by the atomic layer deposition process according to an embodiment of the present invention has more uniform tantalum doping distribution in comparison with the layer formed by the general atomic layer deposition process.

FIGS. 10 to 14 are graphs illustrating characteristics of tantalum doping concentrations in a layer formed by an atomic layer deposition process according to an embodiment of the present invention and a layer formed by a general atomic layer deposition process.

Figure 10:
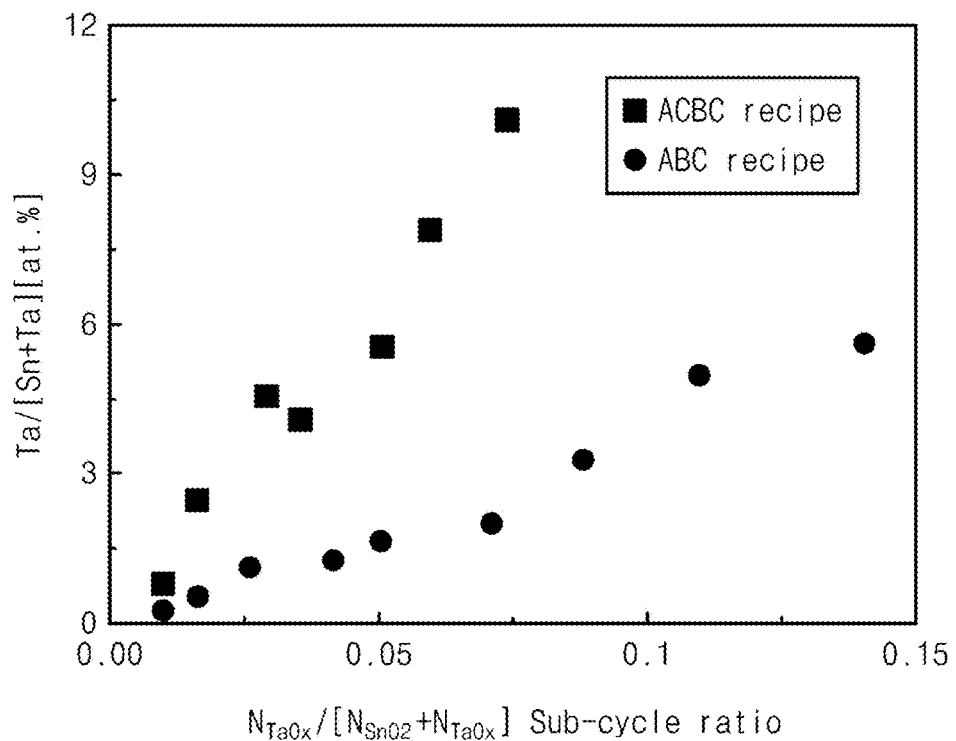
FIGS. 10 to 14 are graphs illustrating characteristics of tantalum doping concentrations in a layer formed by an atomic layer deposition process according to an embodiment of the present invention and a layer formed by a general atomic layer deposition process.
Figure 11:
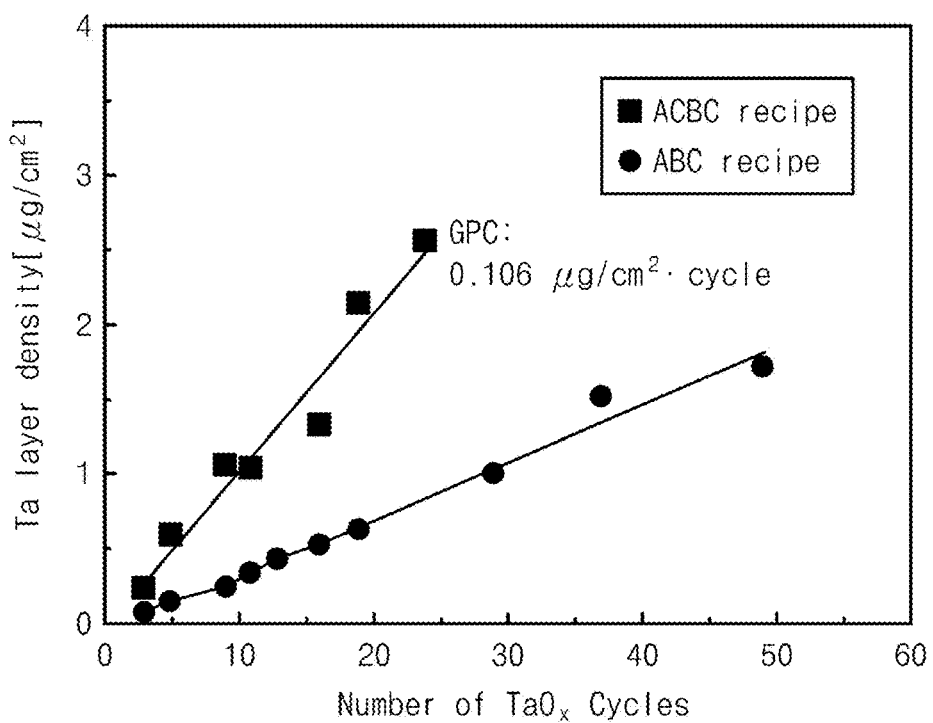
Figure 12:
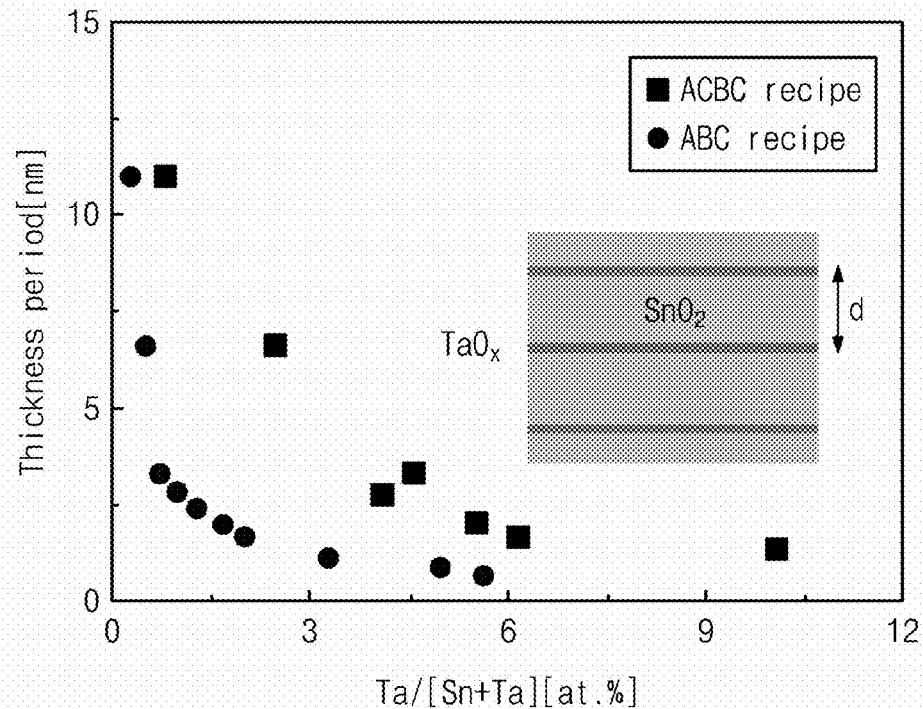

FIGS. 10 to 12, red square dots (or a graph connecting red square dots) represent the characteristics of the layer formed by the general atomic layer deposition process and blue circular dots (or a graph connecting blue circular dots) represent the characteristics of the layer formed by the atomic layer deposition process according to an embodiment.

In FIG. 10, an x-axis represents the number of second sub-cycles with respect to the sum of the number of the first sub-cycles and the number of the second sub-cycle, i.e., a ratio of the second sub-cycle with respect to the total sub-cycles and an y-axis represents a ratio of an atomic weight of tantalum with respect to the sum of atomic weights of tin and tantalum. It may be seen that, as the second sub-cycle increases, the increase in a proportion of the tantalum atomic weight in the red square dots is larger than that in the blue circular dots. Therefore, it may be seen that, as the number of the second sub-cycles increases (i.e., as the layer is thicker), the tantalum concentration according to an embodiment is increased more slowly.

In FIG. 11, an x-axis represents the number of second sub-cycles and a y-axis represents tantalum density. For example, when the second sub-cycle is repeated 30 times, the graph connecting red square dots has a slope of 0.106 $\mu g/cm^2 \cdot cycle$ and the graph connecting blue circular dots has a slope of 0.038 $\mu g/cm^2 \cdot cycle$. Thus, it may be seen that, as the number of second sub-cycles increases (i.e., as the layer is thicker), the increase in the tantalum concentration according to an embodiment is increased more slowly.

In FIG. 12, an x-axis represents the ratio of the tantalum atomic weight to the sum of the atomic weights of tin and tantalum and a y-axis represents a distance 'd' between adjacent tantalum layers. It may be seen that the distance between the adjacent tantalum layers in the red square dots is larger than that in the blue circular dots. The smaller distance between the adjacent tantalum layers may indicate a uniform distribution of tantalum. Therefore, it may be seen that tantalum is uniformly distributed throughout the layer formed by the atomic layer deposition process according to an embodiment of the present invention.

Figure 13:
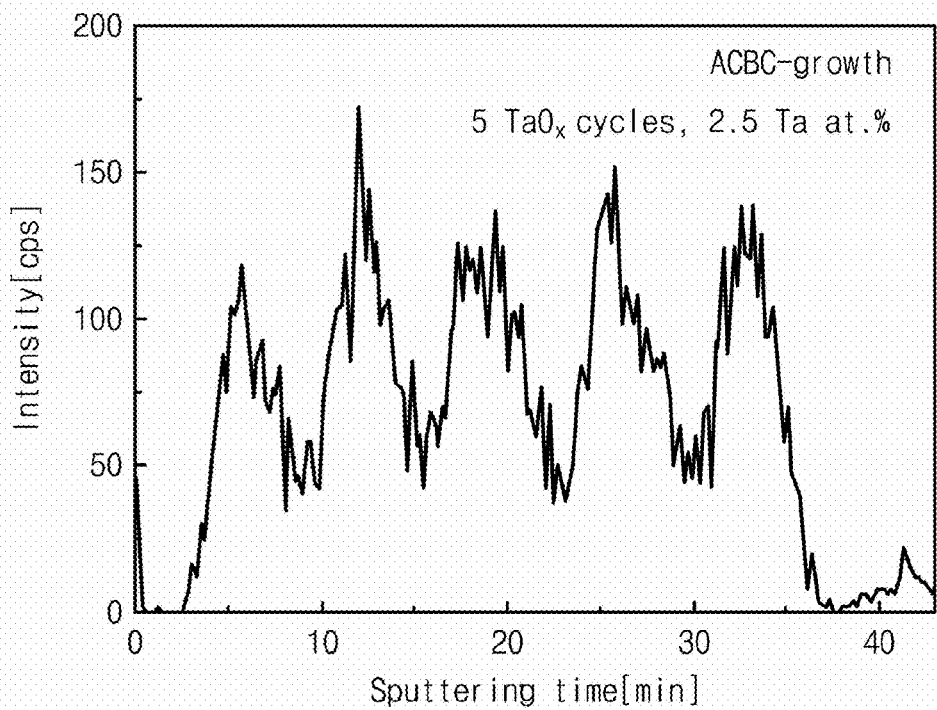
Figure 14:
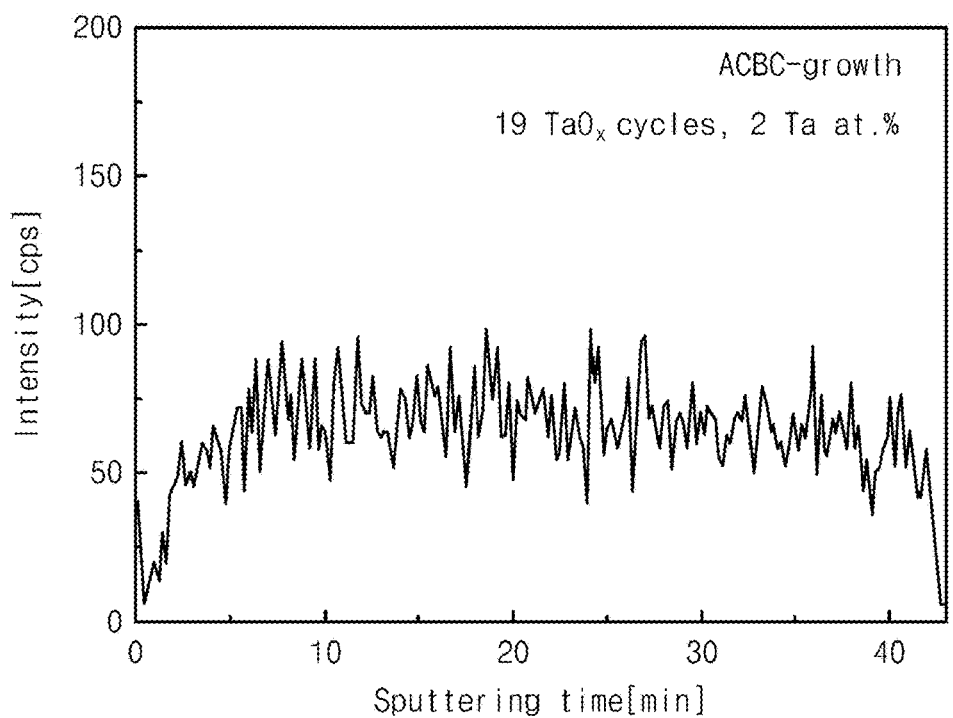

FIG. 13 is a graph illustrating tantalum intensity during etching of a layer formed by the general atomic layer deposition process from a top to a bottom by a sputtering process using a secondary ion mass spectroscopy and FIG. 14 is a graph illustrating tantalum intensity during etching of a layer formed by the atomic layer deposition process according to an embodiment of the present invention from a top to a bottom by a sputtering process using a secondary ion mass spectroscopy. In FIGS. 13 and 14, an x-axis represents a time of the sputtering process and a y-axis represents tantalum strength.

In FIG. 13, the layer formed by repeating the second sub-cycles five times is used. In FIG. 14, the layer formed by repeating the second sub-cycles 19 times is used. It may be seen that a width between the highest and lowest points of intensity in FIG. 13 is greater than that in FIG. 14 and a distance between the highest points in FIG. 13 is greater than that in FIG. 14. It may be seen that the tantalum concentration of the layer formed by the atomic layer deposition process according to an embodiment of the present invention is more uniformly distributed.

Figure 15:
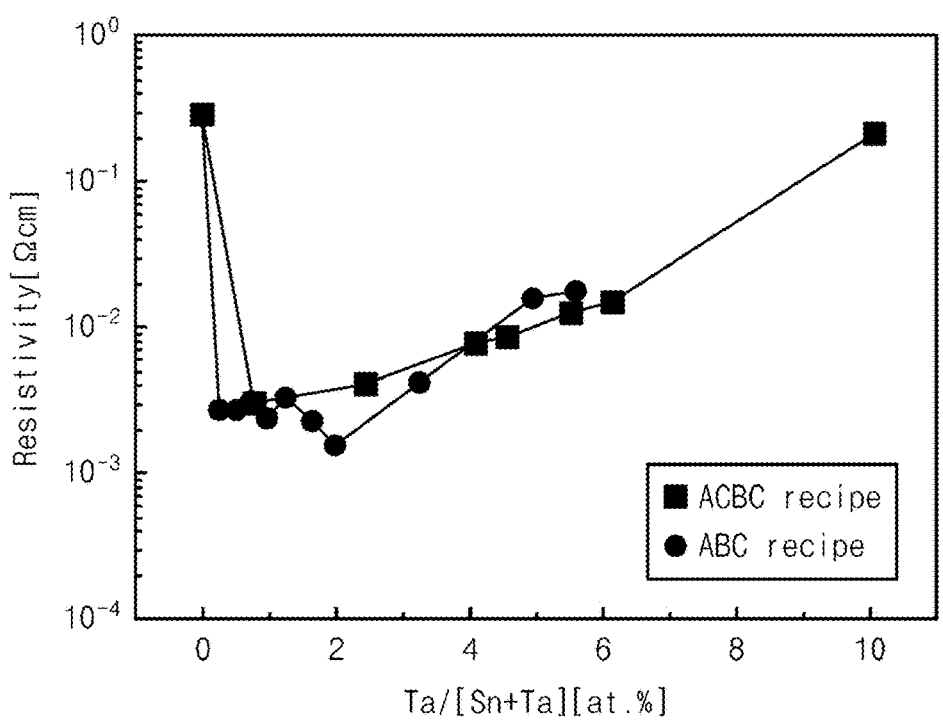
FIGS. 15 and 16 are graphs illustrating, in a layer formed by atomic layer deposition process according to an embodiment of the present invention and a layer formed by a general atomic layer deposition process, electrical resistivity and carrier concentration of the layers depending on a tantalum doping concentration.
Figure 16:
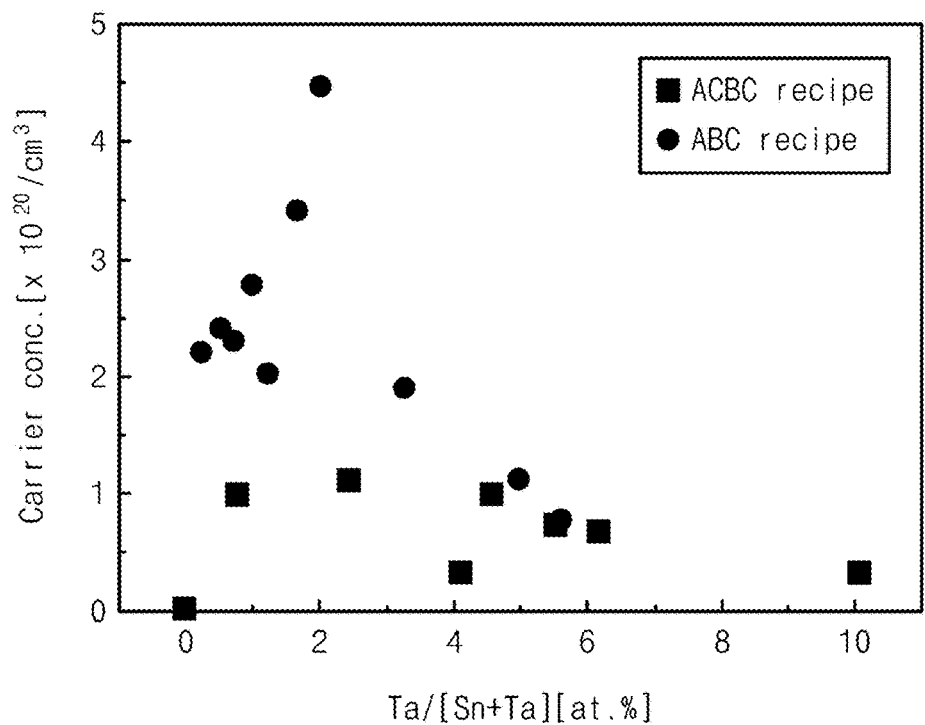

FIGS. 15 and 16 are graphs illustrating, in a layer formed by atomic layer deposition process according to an embodiment of the present invention and a layer formed by a general atomic layer deposition process, electrical resistivity and carrier concentration of the layers depending on a tantalum doping concentration. In FIGS. 15 and 16, red square dots (or a graph connecting red square dots) represent characteristics of the layer formed by the general atomic layer deposition process and blue circular dots (a graph connecting blue circular dots) represent characteristics of the layer formed by the atomic layer deposition process according to an embodiment.

In FIG. 15, an x-axis represents a ratio of the tantalum atomic weight to the sum of the atomic weights of tin and tantalum and a y-axis represents electrical resistivity. In FIG. 15, as the tantalum concentration increases, it shows a tendency to exhibit high electrical resistivity. However, referring to FIG. 15, in the graph connecting the red square dots, the lowest electrical resistivity of $3 \times 10^{-3}$ $\Omega \cdot cm$ at 0.8 at % is shown. On the other hand, in the graph connecting the blue circular dots, the lowest electrical resistivity of $1.5 \times 10^{-3}$ $\Omega \cdot cm$ at 2.0 at % is shown.

Therefore, it may be seen that the layer formed by the atomic layer deposition process according to an embodiment of the present invention exhibits the lower electrical resistivity at the higher tantalum concentration in comparison with the layer formed by the general atomic layer deposition process.

In FIG. 16, an x-axis represents the ratio of the tantalum atomic weight to the sum of the atomic weights of tin and tantalum and a y-axis represents density of free electrons. In FIG. 16, as the concentration of tantalum increases, the electron density tends to decrease. However, the red square dots show the smallest electron density of $1 \times 10^{20}/cm^3$ at 5 at %. The blue circular dots show the highest electron density of about $4.5 \times 10^{20}/cm^3$ at 2.5 at %. In addition, in the blue circular dots, it may be seen that the electron density increases linearly to 2.5 at % and the electron density rapidly decreases at 2.5 at % or more. When the tantalum concentration is 3.0 at % or more, the distance between the adjacent tantalum doped layers may be shorter than a critical distance. As an example of a thin layer formed by the atomic layer deposition process according to an embodiment, the distance between the tantalum doped layers is only 1.1 nm at a tantalum concentration of 3.3 at % and the thickness between the tantalum doped layers is much smaller than three layers of the rutile unit cell. Therefore, interference may occur beyond the role of tantalum substituting for tin ions to supply free electrons.

Figure 17:
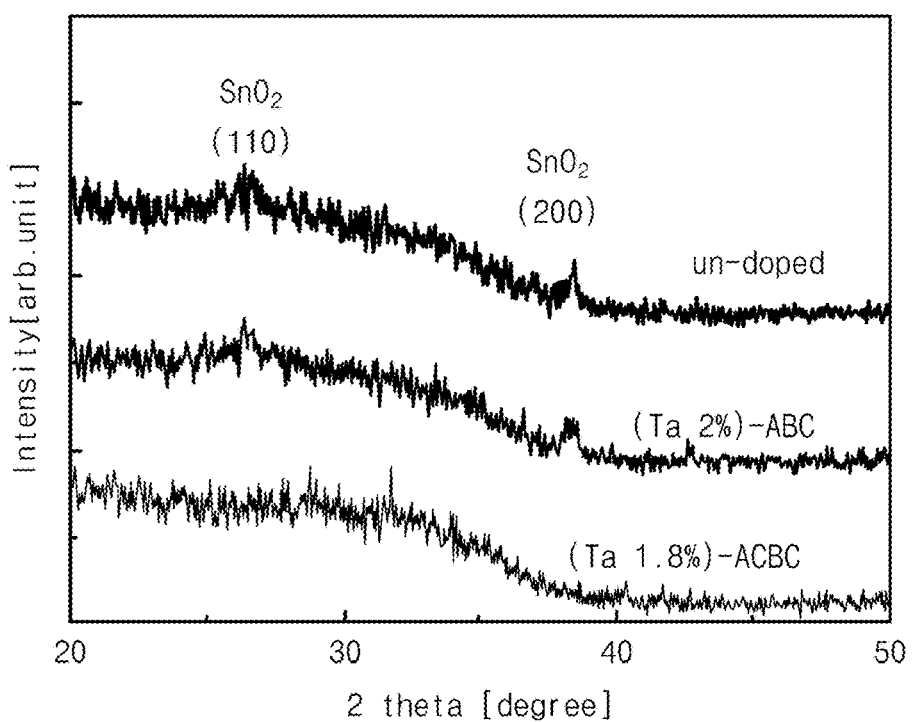
FIG. 17 is a graph of grazing incidence x-ray diffraction (GIXRD) analysis of a tantalum-doped tin oxide layer formed by a general atomic layer deposition process and a tantalum-doped tin oxide layer formed by an atomic layer deposition process according to an embodiment of the present invention.

FIG. 17 is a graph of grazing incidence x-ray diffraction (GIXRD) analysis of a tantalum-doped tin oxide layer formed by a general atomic layer deposition process and a tantalum-doped tin oxide layer formed by an atomic layer deposition process according to an embodiment of the present invention. In FIG. 17, a blue graph shows an analysis of a tin oxide layer doped with a tantalum concentration of 2.0 at % formed by the atomic layer deposition process according to an embodiment of the present invention and a red graph shows an analysis of a tin oxide layer doped with a tantalum concentration of 1.8 at % formed by the general atomic layer deposition process. A black graph is an analysis of tin oxide layer without tantalum. The thickness of each tin oxide layers is about 35 nm. In the black graph, peaks (110) and (200) of the tin oxide occurs. However, it may be seen that the peaks (110) and (200) of the tin oxide do not appear in the red graph even though the tantalum concentration of the red graph is lower than the tantalum concentration of the blue graph. On the other hand, in the tantalum-doped tin oxide layer formed by the atomic layer deposition process according to an embodiment of the present invention, the peaks (110) and (200) of the tin oxide appear. Therefore, in the tantalum-doped tin oxide layer formed by the atomic layer deposition process according to an embodiment, it may be seen that tantalum is doped and crystallographically exhibits tin oxide characteristics.

Figure 18:
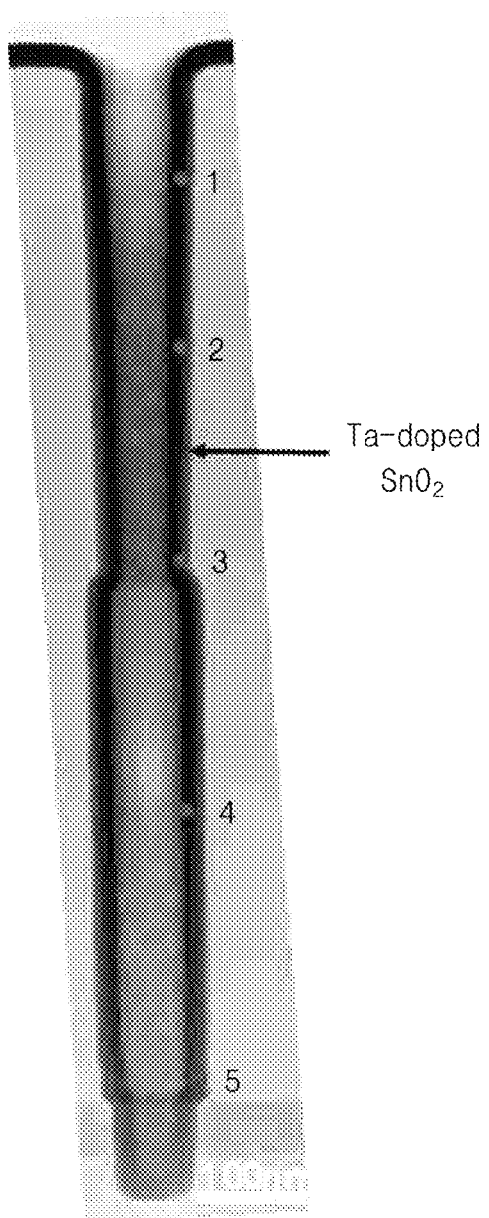
FIG. 18 is a TEM photograph of a cylindrical lower electrode formed according to an embodiment of the present invention.
Figure 19:
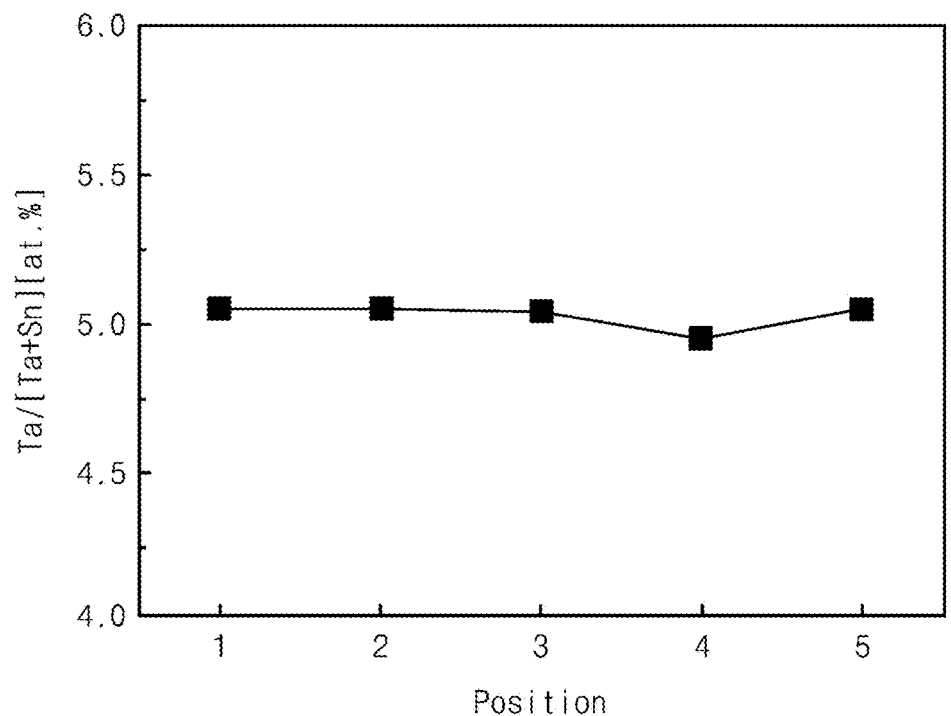
FIG. 19 is a graph illustrating tantalum concentrations of selected points in the lower electrode of FIG. 18.

FIG. 18 is a TEM photograph of a cylindrical lower electrode formed according to an embodiment of the present invention and FIG. 19 is a graph illustrating tantalum concentrations of selected points in the lower electrode of FIG. 18.

In FIG. 18, the cylindrical lower electrode has a closed cylindrical shape and is formed by the atomic layer deposition process according to an embodiment. Here, a diameter of the hole is about 100 nm, a depth of the hole is about 1 μm, and thus the cylinder lower electrode has an aspect ratio of about 10. The lower electrode is formed to have a thickness of about 23 nm. As shown in FIG. 18, in a structure having the high aspect ratio, the layer having excellent step coverage characteristics may be conformally formed using the atomic layer deposition process. In FIG. 19, it may be seen that the points selected at the lower electrode of FIG. 18 have similar tantalum concentrations of about 5 at %. Therefore, referring to FIGS. 18 and 19, the lower electrode having the high aspect ratio structure may be formed using the atomic layer deposition process according to an embodiment of the present invention to have an excellent step coverage while maintaining the uniform tantalum doping concentration.

Figure 20:
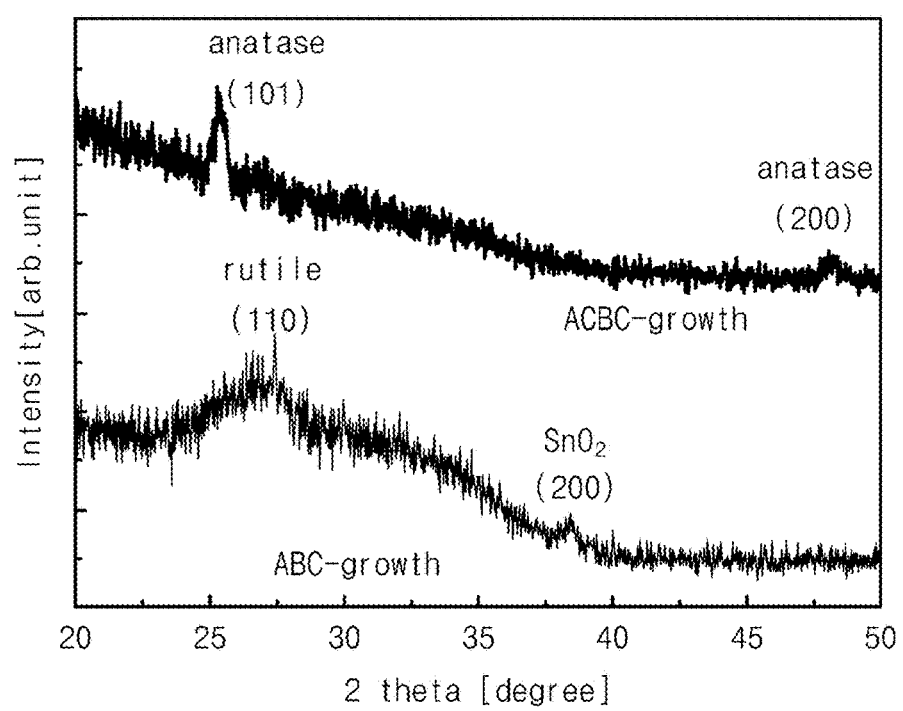
FIG. 20 is a GIXRD analysis graph illustrating a crystalline structures in specimens including a titanium oxide formed by an atomic layer deposition process on a layer formed using a general atomic layer deposition process and on a layer formed using an atomic layer deposition process according to an embodiment of the present invention.

FIG. 20 is a GIXRD analysis graph illustrating a crystalline structure of a layer including a titanium oxide formed by an atomic layer deposition process on a layer formed using a general atomic layer deposition process and on a layer formed using an atomic layer deposition process according to an embodiment of the present invention.

As described above, the titanium oxide, i.e., the dielectric layer formed on the lower electrode should have a rutile structure, not an anatase structure to have the high-k.

The tantalum-doped tin oxide layers are formed by the general atomic layer deposition process and by the atomic layer deposition process according to an embodiment to have a thickness of 32 nm and the tantalum doping concentration of 2.0 at %. Then, The tantalum-doped tin oxide layers are used as lower substrates, the titanium oxide is formed on the lower substrates at 250° C. using kis-isopropoxide and ozone ($O_3$), and crystal structures of the layers are confirmed through GIXDR analysis.

Referring to FIG. 20, the titanium oxide thin layer disposed on the tantalum-doped tin oxide layer, which is formed by the general atomic layer deposition process and serves as the lower electrode, has an anatase structure having a relatively low dielectric constant of about 40. On the other hand, the titanium oxide thin layer disposed on the tantalum-doped tin oxide layer, which is formed by the atomic layer deposition process according to an embodiment of the present invention and serves as a lower electrode, has the rutile structure having a relatively high dielectric constant of about 80.

Figure 21:
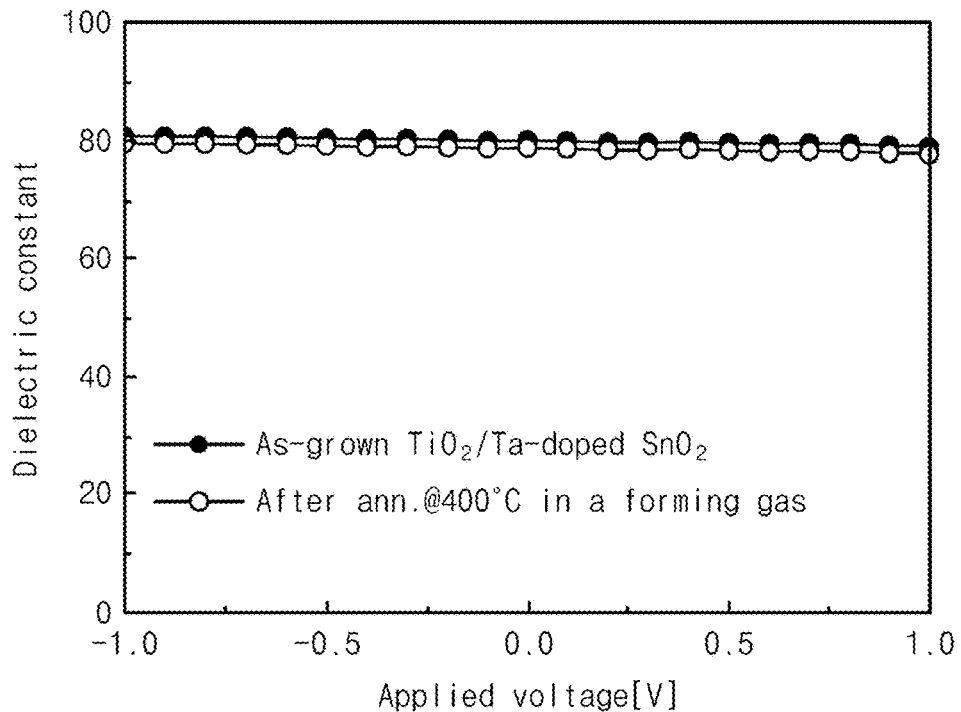
FIG. 21 is a graph illustrating a change in dielectric constants depending on a voltage change before and after heat treatment under reducing atmosphere including hydrogen to a titanium oxide, which is formed by an atomic layer deposition process on a lower electrode of a tantalum-doped tin oxide layer formed by an atomic layer deposition process according to an embodiment of the present invention.
Figure 22:
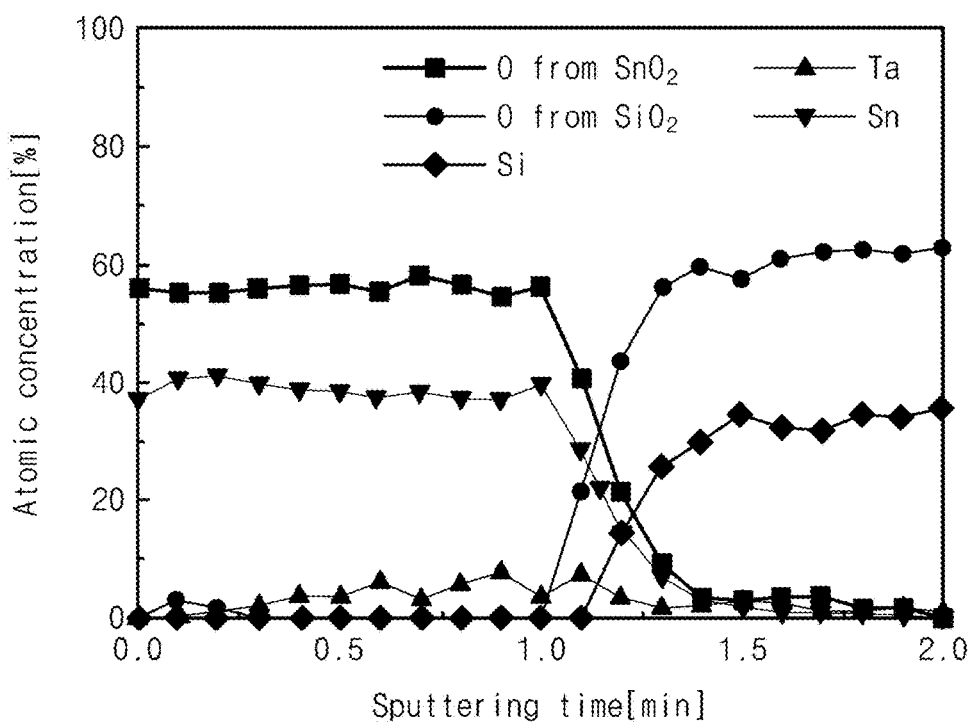
FIGS. 22 and 23 are graphs illustrating auger electron spectroscopy (AES) depth profile analysis before and after heat treatment under reducing atmosphere including hydrogen to a tantalum-doped tin oxide layer formed by an atomic layer deposition process according to an embodiment of the present invention.
Figure 23:
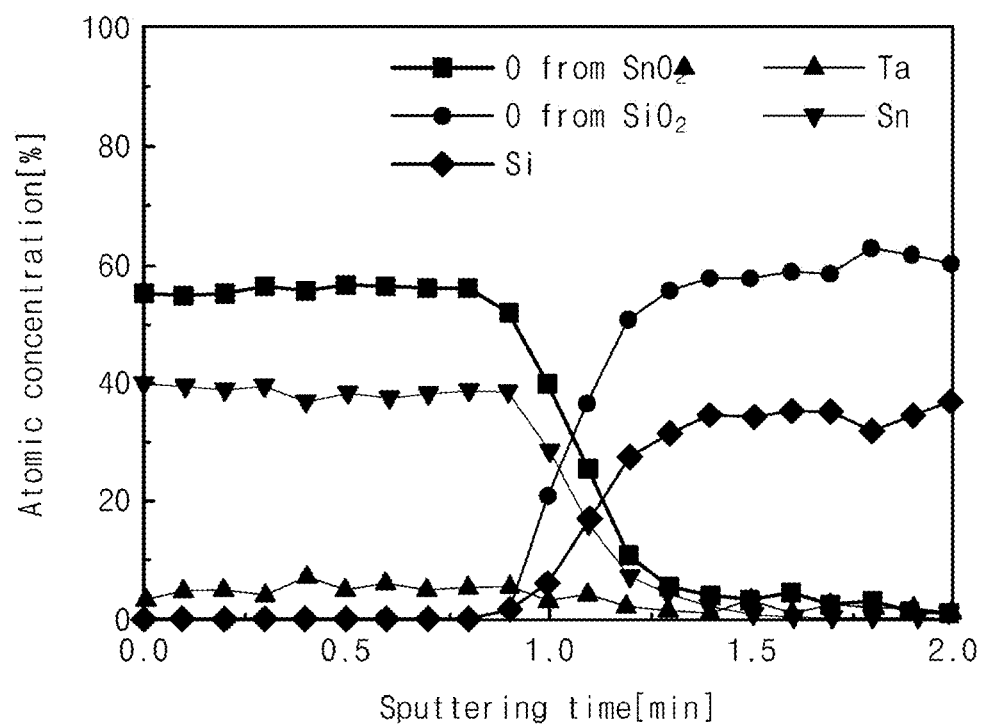

FIG. 21 is a graph illustrating a change in dielectric constants depending on a voltage change before and after heat treatment under reducing atmosphere including hydrogen to a titanium oxide, which is formed by an atomic layer deposition process on a lower electrode of a tantalum-doped tin oxide layer formed by an atomic layer deposition process according to an embodiment of the present invention. FIGS. 22 and 23 are graphs illustrating auger electron spectroscopy (AES) depth profile analysis before and after heat treatment under reducing atmosphere including hydrogen to a tantalum-doped tin oxide layer formed by an atomic layer deposition process according to an embodiment of the present invention.

FIGS. 21 to 23, as described with reference to FIG. 19, the tantalum-doped tin oxide layer having the thickness of 32 nm and the tantalum doping concentration of 2.0 at % is formed by the atomic layer deposition process according to an exemplary embodiment.

Referring to FIG. 21, the titanium oxide having the tantalum-doped tin oxide layer, which is formed by the atomic layer deposition process according to an embodiment and serves as the lower substrate, has a dielectric constant of 80. The dielectric constant is maintained at 80 even after the layer is heated in a reducing forming gas atmosphere containing hydrogen at about 400° C. for 30 minutes. The tantalum-doped tin oxide layer according to an embodiment should be thermally or chemically stable in a subsequent process in order to be used in a DRAM capacitor. It may be seen that the tantalum-doped tin oxide layer formed by the atomic layer deposition process according to an embodiment of the present invention maintains the rutile structure even after the heat treatment to maintain the electrical characteristics.

FIG. 22 is the AES depth profile of the tantalum-doped tin oxide layer before heat treatment, and FIG. 23 is the AES depth profile of the tantalum-doped tin oxide layer after heat treatment under the reducing atmosphere containing hydrogen. FIGS. 22 and 23, it may be seen that the AES depth profiles of the tantalum-doped tin oxide layer before and after the heat treatment are the same. Therefore, it may be seen that the tantalum-doped tin oxide layer formed by the atomic layer deposition process according to an embodiment of the present invention maintains the rutile structure while maintaining the chemical composition without being reduced even after heat treatment under the reducing atmosphere including hydrogen.

According to an embodiment of the present invention, in the second sub-cycle of forming the tantalum oxide layer, the tin precursor may be provided and then the tantalum precursor may be provided directly without the purge gas supply to form the electrode layer having the uniform tantalum doping concentration. Therefore, the electrical resistivity of the entire electrode layer may be reduced. In addition, the electrode layer having the rutile structure may be formed and thus, the dielectric layer having the high dielectric constant may be formed to improve performance of the capacitor.

In addition, the electrode layer may be conformally formed even in the structure having the high aspect ratio using the atomic layer deposition process.

Figure 24:
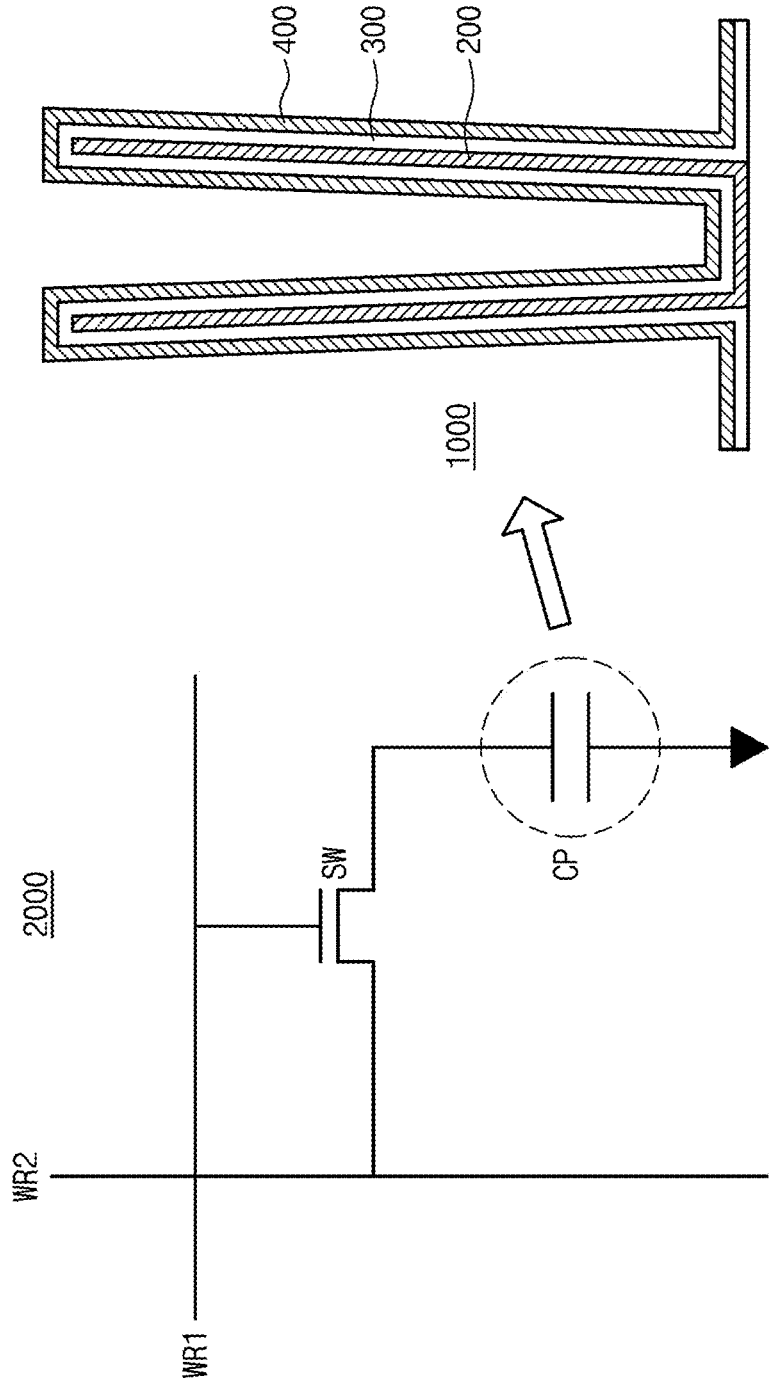
FIG. 24 is a circuit diagram illustrating a memory device according to an embodiment of the present invention.

FIG. 24 is a circuit diagram illustrating a memory device according to an embodiment of the present invention.

Referring to FIG. 24, a memory device 2000 may include a switching element SW, a first wiring WR1, a second wiring WR2, and a capacitor CP. In addition, although not shown, the memory device 2000 may further include a substrate.

The substrate may include a semiconductor material, such as silicon (Si), germanium (Ge), gallium arsenide (GaAs), zinc oxide (ZnO), silicon carbide (SiC), silicon germanium (SiGe), gallium nitride (GaN)), Gallium (III) oxide ($Ga_2O_3$), and sapphire.

On the other hand, the substrate may include a conductive material, for example, gold (Au), nickel (Ni), tungsten (W), molybdenum (Mo), copper (Cu), aluminum (Al), tantalum (Ta), silver (Ag), platinum (Pt), chromium (Cr), or alloys thereof.

The switching element SW may be disposed on the substrate. According to this embodiment, the switching element SW may be a transistor. Although not shown, the transistor may include a gate extending in a first direction, a gate insulating film interposed between the gate and the substrate, and source and drain disposed on both sides of the gate.

The first wiring WR1 may be a wiring that is electrically connected to the gate of the switching element SW to determine on/off of the transistor. Meanwhile, the first wiring WR1 is omitted, and a gate extending in the first direction may perform a function of the first wiring WR1.

The second wiring WR2 may be disposed on another layer to be insulated from the first wiring WR1 and may extend in a second direction perpendicular to the first direction. The second wiring WR2 may be electrically connected to the source (or drain) of the switching element SW. The second wiring WR2 may be used for read and write operations of the memory device 2000.

The capacitor CP may be disposed on another layer to be insulated from the first wiring WR1 and the second wiring WR2. The capacitor CP may be electrically connected to the drain (or source) of the transistor. According to an embodiment of the present invention, the capacitor CP may have a cylinder or pillar shape with a lower portion blocked. The capacitor CP may include the lower electrode 200, the dielectric layer 300, and the upper electrode 400. The description of the capacitor CP will be omitted as it is the same as the description of FIG. 1.

The foregoing are specific embodiments for practicing the present invention. In addition to the above-described embodiments, the present invention will also include embodiments that may be simply changed in design or easily changed. In addition, the present invention will also include techniques that are easily modified and practiced using the embodiments. Therefore, the scope of the present invention should not be limited to the above-described embodiments, but should be determined by the equivalents of the claims of the present invention as well as the following claims.

What is claimed is:

1. A method of manufacturing an electrode layer, the method comprising:
    performing a first sub-cycle sequentially providing a tin-containing material and an oxygen-containing material on a substrate;
    performing a second sub-cycle sequentially providing a tin-containing material, a tantalum precursor, and an oxygen-containing material on the substrate on which the first sub-cycle is performed; and
    repeating a cycle including the first sub-cycle and the second sub-cycle to form a tantalum-doped tin oxide layer on the substrate,
    wherein a tantalum concentration in the tantalum-doped tin oxide layer is determined by the tin-containing material provided in the second sub-cycle.

2. The method of claim 1, wherein the performing of the first sub-cycle includes:
    providing a first purge gas after the providing of the tin-containing material; and
    providing a second purge gas after the providing of the oxygen-containing material.

3. The method of claim 1, wherein the performing of the second sub-cycle includes:
    providing a first purge gas after the providing of the tin-containing material;
    providing a second purge gas after the providing of the tantalum precursor; and
    providing a third purge gas after the providing of the oxygen-containing material.

4. The method of claim 1, wherein the electrode layer has a rutile structure.

5. The method of claim 1, wherein, the electrode layer has a tantalum atomic weight 1.0 to 3.0 at % with respect to a sum of the tantalum atomic weight and a tin atomic weight.

6. The method of claim 1, wherein the tin-containing material includes one or more of tetrakis(dimethylamino)tin (TDMASn), tetraethyltin (TET), tetramethyltin (TMT), tin (II)acetylacetonate ($Sn(acac)_2$), $SnCl_4$, dimethylamino-2-methyl-2-propoxy-tin(II) ($Sn(dmamp)_2$), and Bis[bis(trimethylsilyl)amino]tin(II).

7. The method of claim 1, wherein the oxygen-containing material includes ozone ($O_3$) or water vapor ($H_2O$).

* * * * *